(12) United States Patent
Klein et al.

(10) Patent No.: US 10,929,224 B2
(45) Date of Patent: Feb. 23, 2021

(54) PARTIAL XOR PROTECTION

(71) Applicant: Western Digital Technologies, Inc., San Jose, CA (US)

(72) Inventors: Avi Klein, Tel Aviv (IL); Eran Sharon, Tel Aviv (IL); Gadi Vishne, Petach-Tikva (IL); Igor Genshaft, Bat Yam (IL); Marina Frid, Jerusalem (IL); Michal Silbermintz, Tel Mond (IL)

(73) Assignee: Western Digital Technologies, Inc., San Jose, CA (US)

( * ) Notice: Subject to any disclaimer, the term of this patent is extended or adjusted under 35 U.S.C. 154(b) by 22 days.

(21) Appl. No.: 16/447,861

(22) Filed: Jun. 20, 2019

(65) Prior Publication Data

US 2020/0401477 A1 Dec. 24, 2020

(51) Int. Cl.
*G06F 11/10* (2006.01)
*G11C 29/52* (2006.01)
*G06F 3/06* (2006.01)

(52) U.S. Cl.
CPC ........ *G06F 11/1068* (2013.01); *G06F 3/0616* (2013.01); *G06F 3/0659* (2013.01); *G06F 3/0679* (2013.01); *G11C 29/52* (2013.01)

(58) Field of Classification Search
CPC .. G06F 11/1068; G06F 3/0616; G06F 3/0659; G06F 3/0679; G11C 29/42; G11C 29/52
See application file for complete search history.

(56) References Cited

U.S. PATENT DOCUMENTS

| | | | |
|---|---|---|---|
| 8,832,507 B2 | 9/2014 | Post et al. | |
| 8,953,398 B2 | 2/2015 | Lee et al. | |
| 9,009,398 B2 * | 4/2015 | Avila | G06F 11/1072 |
| | | | 711/103 |
| 9,501,400 B2 | 11/2016 | Yeung et al. | |
| 9,760,303 B2 | 9/2017 | Ea et al. | |
| 9,875,085 B2 | 1/2018 | Mukhopadhyay et al. | |
| 9,997,258 B2 | 6/2018 | Shepard et al. | |
| 2012/0030531 A1 * | 2/2012 | Brewerton | G11C 29/024 |
| | | | 714/719 |
| 2017/0110200 A1 * | 4/2017 | Kim | G11C 17/18 |
| 2017/0228299 A1 * | 8/2017 | Shapira | G06F 3/0652 |

* cited by examiner

*Primary Examiner* — Shelly A Chase
(74) *Attorney, Agent, or Firm* — Vierra Magen Marcus LLP

(57) ABSTRACT

A system and method for applying a first level of protection to data in a memory module include identifying a weak wordline from at least one of a plurality of blocks of the memory module. Each of the plurality of blocks includes a plurality of wordlines. The system and method also include determining that the weak wordline is to receive the first level of protection and applying the first level of protection to the weak wordline.

20 Claims, 10 Drawing Sheets

PARTIAL XOR PROTECTION

BACKGROUND

The following description is provided to assist the understanding of the reader. None of the information provided or references cited is admitted to be prior art.

Memory devices are used in a wide variety of applications for storing data in one or more memory modules of a memory device. Data in each of the one or more memory modules may be protected using a protection mechanism for decreasing the risk of losing that data. However, the present day techniques that protect data stored in the one or more memory modules have limitations in the way those protection techniques are configured.

SUMMARY

In accordance with some aspects of the present disclosure, a method is disclosed. The method includes identifying a weak wordline from at least one of a plurality of blocks of a memory module. Each of the plurality of blocks includes a plurality of wordlines. The method also includes determining that the weak wordline is to receive a first level of protection and applying the first level of protection to the weak wordline.

In accordance with some other aspects of the present disclosure, a non-transitory computer-readable media having computer-readable instructions stored thereon is disclosed. The instructions when executed by a processor associated with a memory module performs a process including categorizing each block of the memory module into a first pool or a second pool. The second pool includes suspected grown bad blocks of the memory module and the first pool includes remaining blocks of the memory module that are not the suspected grown bad blocks. Each of the blocks of the memory module includes a plurality of wordlines. The process also includes applying a first level of protection to each of the plurality of wordlines of each of the suspected grown bad blocks in the second pool, periodically monitoring the remaining blocks of the memory module in the first pool for identifying an additional suspected grown bad block, transferring the additional suspected grown bad block to the second pool, and applying the first level of protection to each of the plurality of wordlines of the additional suspected grown bad block.

In accordance with yet other aspects of the present disclosure, a memory device is disclosed. The memory device includes a plurality of memory modules, each of the plurality of memory modules having a plurality of blocks, and each of the plurality of blocks having a plurality of wordlines. The memory device also includes a memory controller associated with each of the plurality of memory modules. The memory controller includes programmed instructions to identify a group of weak wordlines from each of the plurality of blocks, identify a subset of wordlines from the group of weak wordlines from each of the plurality of blocks for XOR protection, and apply the XOR protection to each of the subset of wordlines of each of the plurality of blocks.

The foregoing summary is illustrative only and is not intended to be in any way limiting. In addition to the illustrative aspects, embodiments, and features described above, further aspects, embodiments, and features will become apparent by reference to the following drawings and the detailed description.

Figure 1:
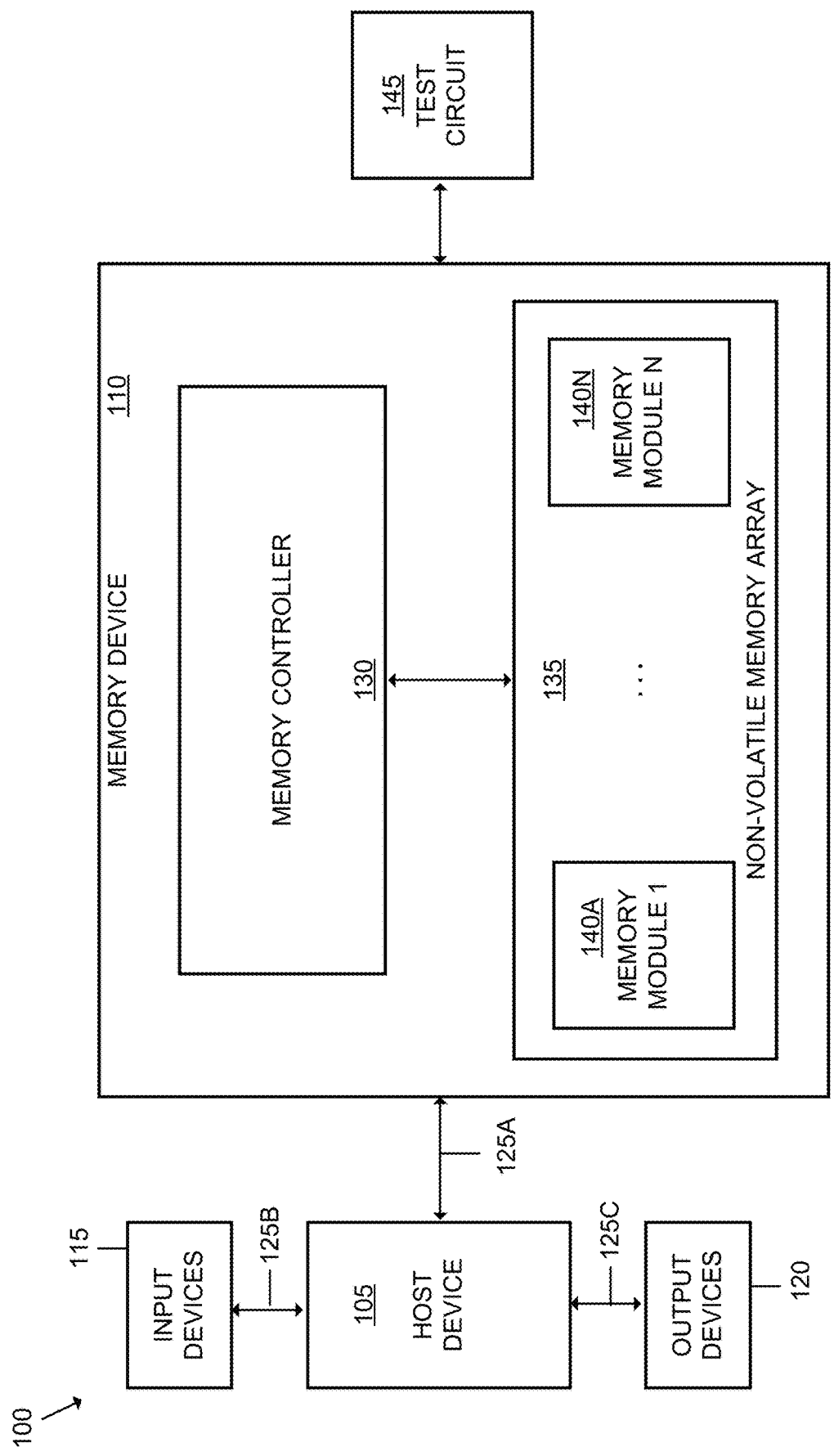
FIG. 1 is an example block diagram of a computing system, in accordance with some embodiments of the present disclosure.

The foregoing and other features of the present disclosure will become apparent from the following description and appended claims, taken in conjunction with the accompanying drawings. Understanding that these drawings depict only several embodiments in accordance with the disclosure and are therefore, not to be considered limiting of its scope, the disclosure will be described with additional specificity and detail through use of the accompanying drawings.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

The present disclosure is directed to a memory device having a memory controller communicably coupled to one or more memory modules. Each of the one or more memory modules includes a plurality of blocks and each of the plurality of blocks includes a plurality of NAND strings connected to a plurality of wordlines. Each of the plurality of NAND strings is also connected to a bit line. Each of the plurality of NAND strings may be controlled by applying appropriate voltages to the bit line and the plurality of word lines to read, write, or erase data. In some cases data that is stored within the plurality NAND strings may be protected to reduce the risk of losing that data. One such protection mechanism is an exclusive OR ("XOR") protection.

Using the XOR protection, an XOR operation may be performed on bits of data before the data is stored. The result of the XOR operation may be considered an XOR signature, and may be stored along with the data. The XOR signature may be used to recover data when the data is lost or is unrecoverable by other error correction means (e.g., using error correcting codes). To recover data using the XOR signature, the XOR operation on the portions of the data may be reversed. While effective, XOR protection may have several drawbacks. For example, XOR protection implementations require overprovisioning of the memory since the XOR signature needs to be stored along with the data. Applying XOR protection to each piece of data in each of the plurality of blocks of a memory module and storing the XOR signature of each piece of data exacerbates the memory overprovisioning requirements.

Applying the XOR protection to each of the plurality blocks (called a full XOR protection), thus, requires a large memory (e.g., a large static random access memory or dynamic random access memory), which may increase the cost of the memory controller, and therefore, the overall cost of the memory device. Applying the XOR protection to each of the plurality of blocks may also introduce a large latency penalty during data recovery, which may be problematic for meeting certain timeout requirements within the memory module. Applying the XOR protection to each of the plurality of blocks also increases the overall complexity of the memory device, including software, hardware, and firmware complexity.

Thus, the present disclosure provides technical solutions for implementing the XOR protection that reduce the complexity and cost of the memory device, while provide an efficient and effective mechanism of protecting data using XOR protection. Specifically, the present disclosure provides a partial XOR protection mechanism in which only certain blocks of a memory module or certain portions of a block of the memory module are XOR protected. The present disclosure also provides a mechanism for identifying which blocks or portions of a block are suitable for XOR protection and applying XOR protection to only those blocks or portions of the block.

In a first partial XOR protection embodiment, "weak" areas in each block may be identified and protected using the XOR protection mechanism. By identifying the "weak" areas, portions of each block that may benefit most from XOR protection may be identified. Further, by applying the XOR protection or another type of designated protection (e.g., single level cell copy protection) to only a portion of each block, the complexity and cost associated with XOR protection may be reduced. In some embodiments, the "weak" areas may be identified by identifying wordlines of that block that may benefit most from XOR protection. Most wordlines in a block are "high" quality and only a fraction of the wordlines are "weak" or "low" quality. Thus, "weak" wordlines of a block may be identified for XOR protection. A wordline may be considered "weak" if it does not meet certain predetermined criteria. A memory health test may be performed on each block to identify the "weak" wordlines in that block. Further, in some embodiments, all of the "weak" wordlines of a particular block may be XOR protected, while in some embodiments, a subset of the "weak" wordlines may be XOR protected. In some embodiments, additional mechanisms, such as wear leveling, may be used along with XOR protection of "weak" wordlines to reduce usage of those wordlines and prolong the operational life of those wordlines.

Memory health testing to identify the "weak" wordlines may be performed during development or fabrication of the associated memory module and/or during operation of the memory module. Further, wordlines (whether "weak" or not) that are not XOR protected may either not be protected at all or protected using other less complex or weaker protection mechanisms such as a simpler XOR protection over a simpler XOR stripe size, using error correction codes, storing data in single level cells, etc. Thus, by applying XOR protection (or another type of designated protection) to only a small group of wordlines in each block of a memory module, the average performance of the memory module may be increased. The wordlines that do not receive the XOR protection (or another type of the designated protection) may either not be protected at all or may receive a simpler type of protection (e.g., error correction code protection, XOR protection over a larger stripe height, etc.)

In a second partial XOR protection embodiment, instead of identifying "weak" wordlines in each block of a memory module, a subset of blocks may be identified that are considered to be suspected grown bad blocks. Most blocks in a memory module are considered "high" quality blocks that do not need XOR protection or for which a simpler or weaker protection may suffice. Thus, only a fraction of blocks (e.g., less than 5% in some embodiments) of a memory module may need XOR protection. This small fraction of blocks may be identified as suspected grown bad blocks. The suspected grown bad blocks, thus, include blocks that have either gone bad or are expected to go bad within a predetermined time period. The suspected grown bad blocks may be identified by memory health testing during development/fabrication and/or operation.

Identifying suspected grown bad blocks (e.g., blocks that may go bad) may be easier than identifying actual grown bad blocks (e.g., blocks that will go bad). Thus, instead of identifying, say 1% of actual grown bad blocks, in some embodiments, a higher percentage, say 10%, of suspected grown bad blocks may be identified. The suspected grown bad blocks are not "bad blocks" and may continue to be used during operation. Bad blocks are not used during operation. In some embodiments, if the percentage of the suspected grown bad blocks is below a certain threshold, a simpler protection mechanism, such as a simpler XOR or protection via storing in single level cells may be used, thereby avoiding using XOR protection completely. Additionally, the blocks that are not the suspected grown bad blocks or bad blocks may either not be protected at all or may also receive a simpler type of protection (e.g., error correction code protection, XOR protection over a larger stripe height, etc.).

A third partial XOR protection embodiment may be a combination of the first and the second embodiments discussed above. For example, a small subset of blocks may be identified for XOR protection. Within that small subset of blocks, "weak" wordlines may be identified for XOR protection (or another type of designated protection), thereby further reducing complexity and cost, and increasing performance of the memory module. Again, blocks/wordlines that do not receive the XOR protection (or another type of designated protection) may either not be protected or may be protected with a simpler form of protection (e.g., error code correction protection, XOR protection over a larger stripe height, etc.).

Referring now to FIG. 1, an example block diagram of a computing system 100 is shown, in accordance with some embodiments of the present disclosure. The computing system 100 includes a host device 105 associated with a memory device 110. The host device 105 may be configured to receive input from one or more input devices 115 and provide output to one or more output devices 120. The host device 105 may be configured to communicate with the memory device 110, the input devices 115, and the output devices 120 via appropriate interfaces 125A, 125B, and 125C, respectively. The computing system 100 may be implemented in a variety of computing devices such as computers (e.g., desktop, laptop, etc.), tablets, personal digital assistants, mobile devices, wearable computing devices such as smart watches, other handheld or portable devices, or any other computing unit suitable for performing operations using the host device 105.

The input devices 115 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 105 and that allows an external source, such as a user, to enter information (e.g., data) into the host device and send instructions to the host device. Similarly, the output devices 120 may include a variety of output technologies such as external memories, printers, speakers, displays, microphones, light emitting diodes, headphones, plotters, speech generating devices, video devices, global positioning systems, and any other output peripherals that are configured to receive information (e.g., data) from the host device 105. The "data" that is either input into the host device 105 and/or output from the host device may include any of a variety of textual data, graphical data, video data, sound data, position data, combinations thereof, or other types of analog and/or digital data that is suitable for processing using the computing system 100.

Although not shown, the host device 105 may include one or more processing units that may be configured to execute instructions for running one or more applications. In some embodiments, the instructions and data needed to run the one or more applications may be stored within the memory device 110. In such cases, the host device 105 may request the memory device 110 to retrieve the data and instructions, which may then at least temporarily be stored within a memory on the host device. The host device 105 may also be configured to store the results of running the one or more applications within the memory device 110. Thus, the host device 105 may be configured to request the memory device 110 to perform a variety of operations. For example, the host device 105 may request the memory device 110 to read data, write data, update or delete data, and/or perform management or other operations.

The memory device 110 includes a memory controller 130 that may be configured to read data from or write data to a non-volatile memory array 135. The non-volatile memory array 135 may include one or more memory modules such as memory modules 140A-140N. Each of the memory modules 140A-140N may include any of a variety of non-volatile memory types. For example, in some embodiments, one or more of the memory modules 140A-140N may include NAND flash memory cores. In other embodiments, one or more of the memory modules 140A-140N may include NOR flash memory cores, Static Random Access Memory (SRAM) cores, Dynamic Random Access Memory (DRAM) cores, Magnetoresistive Random Access Memory (MRAM) cores, Phase Control Memory (PCM) cores, Resistive Random Access Memory (ReRAM) cores, 3D XPoint memory cores, ferroelectric random-access memory (FeRAM) cores, and other types of memory cores that are suitable for use within the non-volatile memory array 135.

The memory modules 140A-140N may be individually and independently controlled by the memory controller 130. In other words, the memory controller 130 may be configured to communicate with each of the memory modules 140A-140N individually and independently. As discussed in greater detail below, the memory modules 140A-140N may remain in a standby state until the memory controller 130 desires to establish communication with one of the memory modules by generating a chip select or chip enable signal. The memory controller 130 may be configured as a logical block or circuitry that receives instructions from the host device 105 and performs operations in accordance with those instructions. For example, the memory controller 130 may be configured to read data from or write data to one or more of the memory modules 140A-140N in response to instructions received from the host device 105. The memory controller 130 may be situated on the same die as the non-volatile memory array 135 or on a different die.

In some embodiments, a test circuit 145 may at least temporarily be associated with the memory device 110. The test circuit 145 may be used to perform memory health testing on the memory modules 140A-140N during fabrication or development of those memory modules or fabrication/development of the memory device 110. In some embodiments, the test circuit 145 may also be used to perform memory health testing during operation (e.g., after development/fabrication) of the memory device 110. In some embodiments, the test circuit 145 may be part of the host device 105. The test circuit 145 may be configured to send test patterns or test commands/data to the memory modules 140A-140N being tested, and receive test results back from those memory modules. The test circuit 145 may also analyze the test results to identify "weak" areas of the memory modules 140A-140N and/or suspected grown bad blocks, as discussed below. The test circuit 145 may be implemented in software, hardware, firmware, or a combination thereof.

It is to be understood that only some components of the computing system 100 are shown and described in FIG. 1. However, the computing system 100 may include other components such as various batteries and power sources, networking interfaces, routers, switches, external memory systems, controllers, etc. Generally speaking, the computing system 100 may include any of a variety of hardware, software, and/or firmware components that are needed or considered desirable in performing the functions described herein. Similarly, the host device 105, the input devices 115, the output devices 120, and the memory device 110 including the memory controller 130 and the non-volatile memory array 135, may include other hardware, software, and/or firmware components that are considered necessary or desirable in performing the functions described herein.

Figure 2A:
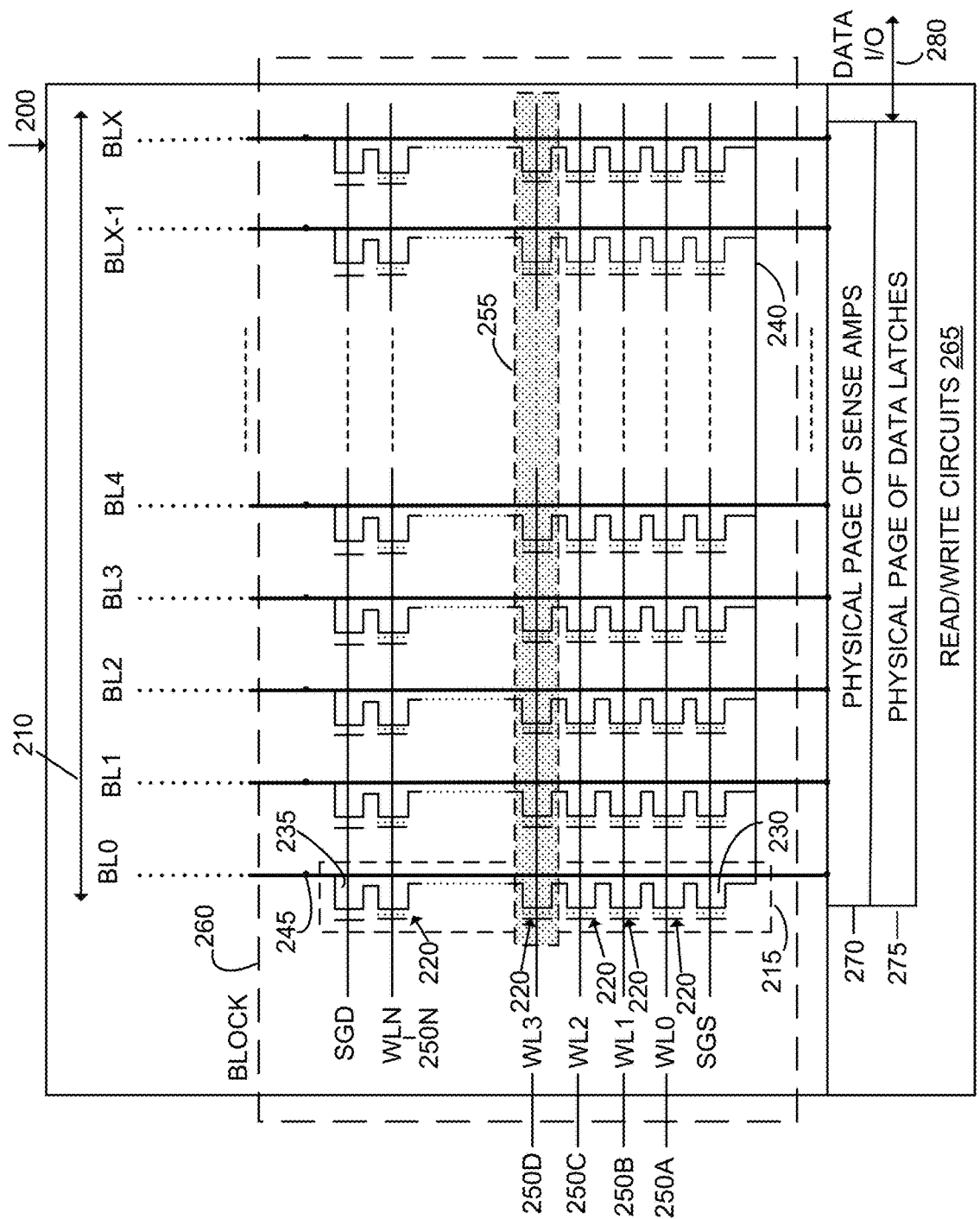
FIG. 2A is an example block diagram showing a memory module of the computing system of FIG. 1 in greater detail, in accordance with some embodiments of the present disclosure.
Figure 2B:
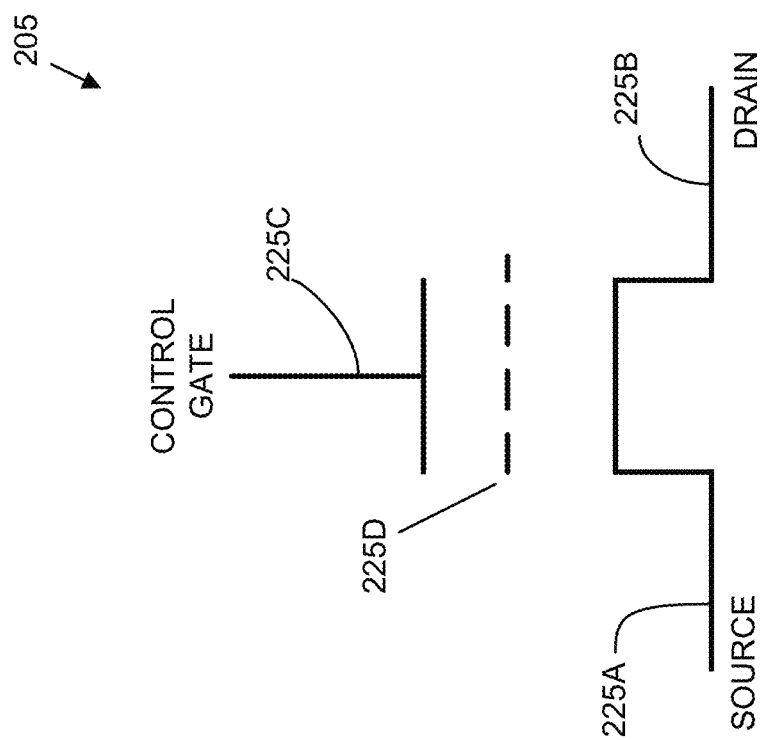
FIG. 2B is an example diagram of a memory cell of the memory module of FIG. 2A, in accordance with some embodiments of the present disclosure.

Turning to FIGS. 2A and 2B, an example block diagram of a memory module 200 is shown in FIG. 2A and an example memory cell 205 is shown in FIG. 2B, in accordance with some embodiments of the present disclosure. The memory module 200 is similar to one of the memory module 140A-140N of FIG. 1. Only certain components of the memory module 200 are shown in FIG. 2A. Nevertheless, other components that are needed or considered desirable to have in performing the functions described herein may be provided in or associated with the memory module 200. The memory module 200 is of NAND memory type. However, in other embodiments, the memory module 200 may be of other memory types, as discussed with respect to FIG. 1. The memory module 200 includes a plurality of NAND strings 210. A NAND string 215 of the plurality of NAND strings 210 includes a plurality of memory cells 220. One or more of the plurality of memory cells 220 may be similar to the memory cell 205 of FIG. 2B.

Referring to FIG. 2B in conjunction with FIG. 2A, in some embodiments, the memory cell 205 may be implemented as a field-effect transistor having a source terminal 225A, a drain terminal 225B, and a control terminal 225C. The memory cell 205 may also include a floating gate 225D configured to store charge. In some embodiments, the floating gate 225D may be insulated to electrically isolate the floating gate and trap the electrical charge therein. Current may flow between the source terminal 22A and the drain terminal 225B under control of the control terminal 225C and the floating gate 225D. In other embodiments, the memory cell 205, and therefore, one or more of the plurality of memory cells 220 may be implemented in other ways. Turning back to FIG. 2A, the plurality of memory cells 220 in the NAND string 215 may be connected together in a daisy-chained fashion, such that the source terminal of one memory cell is connected to the drain terminal of another memory cell. The number of memory cells forming the plurality of memory cells 220 may vary from one embodiment to another. For example, in some embodiments, the number of the plurality of memory cells 220 may include four, eight, sixteen, etc. as desired.

The NAND string 215 may also include a first select transistor 230 and a second select transistor 235 on either side of the plurality of memory cells 220. The first select transistor 230 and the second select transistor 235 may be configured to connect the NAND string to other components of the memory module 200 and/or other components external to the memory module. Each of the first select transistor 230 and the second select transistor 235 may be implemented as a field-effect transistor having a source terminal, a drain terminal, and a control terminal. When the control terminal of the first select transistor 230 is turned on by the control terminal thereof, the source terminal of the first select transistor 230 may be connected to a source line 240. Similarly, when the second select transistor 235 is turned on by the control terminal thereof, the drain of the second select transistor may be connected to a bitline 245. By turning on the first select transistor 230 and the second select transistor 235, the NAND string 215 may be selected to perform read, write, or other operations.

Further, the control terminal of each of the plurality of memory cells 220 is connected to a respective word line such as wordlines 250A-2520N. The wordlines 250A-250N may be used to control read and write operations in the NAND string 215 once the NAND string has been selected by the first select transistor 230 and the second select transistor 235. For example, when the NAND string 215 has been selected, an appropriate voltage may be applied via the wordline (e.g., one of the wordlines 250A-250N) of one of the plurality of memory cells 220 that is desired to be programmed or from which data is to be read. The remaining ones of the plurality of memory cells 220 in the NAND string 215 may be turned on by applying a second appropriate voltage at their respective wordlines. Thus, by controlling the voltage applied to the first select transistor 230, the second select transistor 235, and the wordlines 250A-250N, the NAND string 215 may be operated.

Although only the elements of the NAND string 215 have been described above, it is to be understood that each remaining one of the plurality of NAND strings 210 also includes similar elements. Thus, each remaining one of the plurality of NAND strings 210 includes the plurality of memory cells 220, the first select transistor 230, the second select transistor 235, the bitline 245, and the wordlines 250A-250N.

Additionally, in some embodiments, memory cells of multiple NAND strings may be connected to the same wordline forming a row of memory cells. For example, a row 255 may include one of the plurality of memory cells 220 from multiple ones of the plurality of NAND strings 210. All of the plurality of memory cells 220 in the row 255 may be connected to the same wordline, such as the wordline 250D. By connecting the plurality of memory cells 220 in the row 255 to the wordline 250D, all of the memory cells forming the row may be programmed or read in parallel. The row 255 may be considered to form a page of the memory module 200. The plurality of memory cells 220 forming the row 255 may be programmed/read in parallel by selecting each of the plurality of NAND strings 210 that form part of that row using the first select transistor 230 and the second select transistor 235 of each of those NAND strings, and applying appropriate voltage to the wordline 255D, as well as turning on the remaining memory cells of those NAND strings by applying voltages at their respective wordlines.

Further, some of the plurality of NAND strings 210 may be grouped together to form a "block" of memory cells. For example, the plurality of NAND strings 210 may be grouped together to form a block 260. Although all of the plurality of NAND strings 210 have been shown as being part of the block 260, in some embodiments, the plurality of NAND strings may be grouped together to form multiple blocks. Thus, the memory module 200 may include a single block, as shown in FIG. 2A, or multiple blocks. Likewise, although the row 255 is shown as encompassing all of the plurality of NAND strings 210, in some embodiments, the row 255 may be divided into multiple rows, with each row being connected to a separate wordline.

The memory module 200 may also include read/write circuits 265 that facilitate reading/writing operation in the plurality of NAND strings 210. For example, the read/write circuits 265 may include a bank of sense amplifiers 270 and a bank of latches 275 connected to the bitline 245 of each of the plurality of NAND strings 210. The sense amplifiers 270 may be used to send data to be programmed within the selected row (e.g., the row 255) to be programmed or receive the data read from the selected row. The latches 275 may be used to temporarily store I/O data 280 to be written into the selected row (e.g., the row 255) or read data to be sent to the I/O data.

Figure 3:
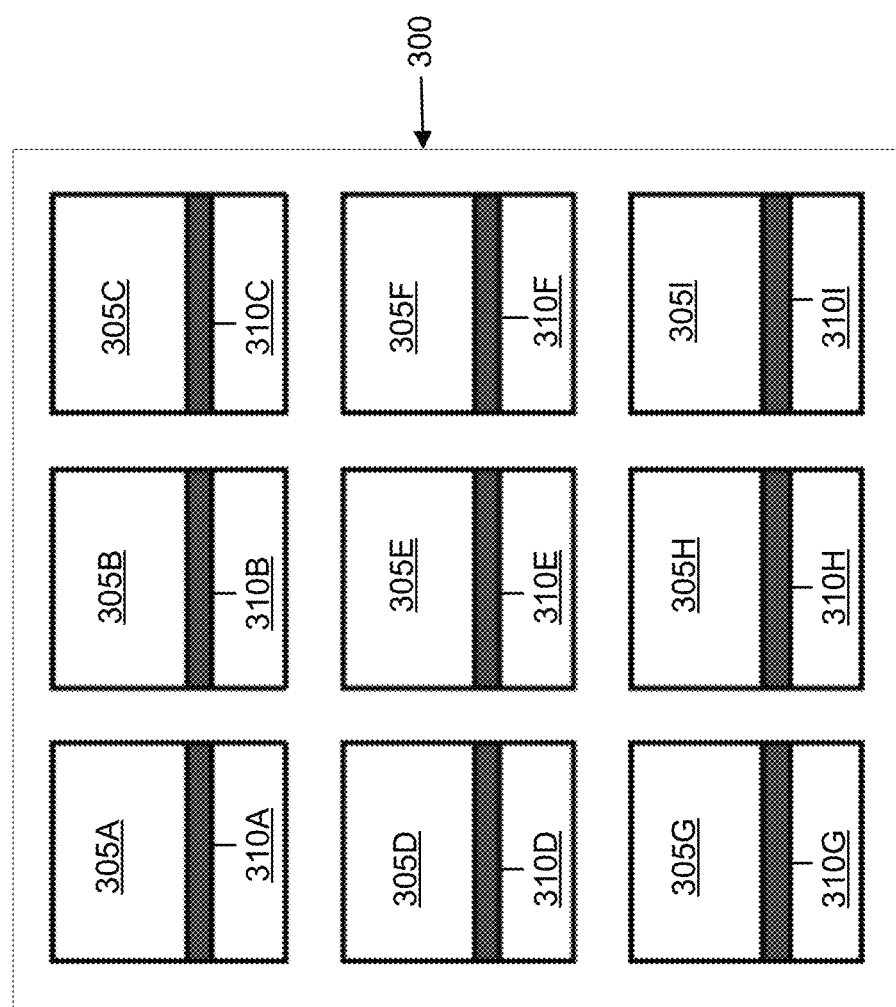
FIG. 3 is an example block diagram of a first embodiment for applying partial XOR protection, in accordance with some embodiments of the present disclosure.

Turning now to FIG. 3, a simplified example block diagram of a memory module 300 is shown, in accordance with some embodiments of the present disclosure. The memory module 300 is similar to the memory module 200 in that the memory module 300 may include similar elements as the memory module 200. For example, although not shown, the memory module 300 may include a plurality of NAND strings, with each of the plurality of NAND strings having a plurality of memory cells, a first select transistor connected to a source line, a second select transistor connected to a bit line, and word lines connected to the control terminal of each of the plurality of memory cells. The memory module 300 may also include read/write circuits similar to the read/write circuits 265. Further, the plurality of NAND strings of the memory module 300 may be grouped into one or more blocks (e.g., similar to the block 260). For example, the memory module 300 may include a plurality of blocks 305A-305I. It is to be understood that the number of the plurality of blocks 305A-305I may vary from one embodiment to another. Further, each of the plurality of blocks 305A-305I may include a plurality of wordlines, only some of which, as discussed below, are shown in FIG. 3.

The memory module 300 implements a partial XOR protection scheme in which certain wordlines of each of the plurality of blocks 305A-305I are XOR protected. For example, a group of wordlines 310A-310I may be identified in each of the plurality of blocks 305A-305I, respectively, for XOR protection. The number of wordlines that are XOR protected in each of the plurality of blocks 305A-305I may vary from one embodiment to another. Further, in some embodiments, the placement of the wordlines that are protected may vary from one embodiment from another. For example, in some embodiments, the first few wordlines may be selected for XOR protection, while in other embodiments, the last few wordlines may be selected for XOR protection. In yet other embodiments, wordlines between the first few and the last few wordlines may be XOR protected.

Additionally, the wordlines 310A-310I that are XOR protected in each of the plurality of blocks 305A-305I need not be contiguous or next to each other. For example, in some embodiments, the first few and the last few wordlines of one or more of the plurality of blocks 305A-305I may be XOR protected. Thus, the number and placement of the wordlines 310A-310I that are XOR protected in each of the plurality of blocks 305A-305I may vary from one embodiment to another. In some embodiments, the wordlines of each of the plurality of blocks 305A-305I that are not XOR protected may be protected using other mechanisms such as simpler XOR, storing data in single level cells, using error correction codes, etc. In other embodiments, the wordlines that are not XOR protected may not be protected at all. By protecting only a subset of wordlines (e.g., the wordlines 310A-310I) of each of the plurality of blocks 305A-305I, the performance of the memory module 300 may be improved.

Figure 4:
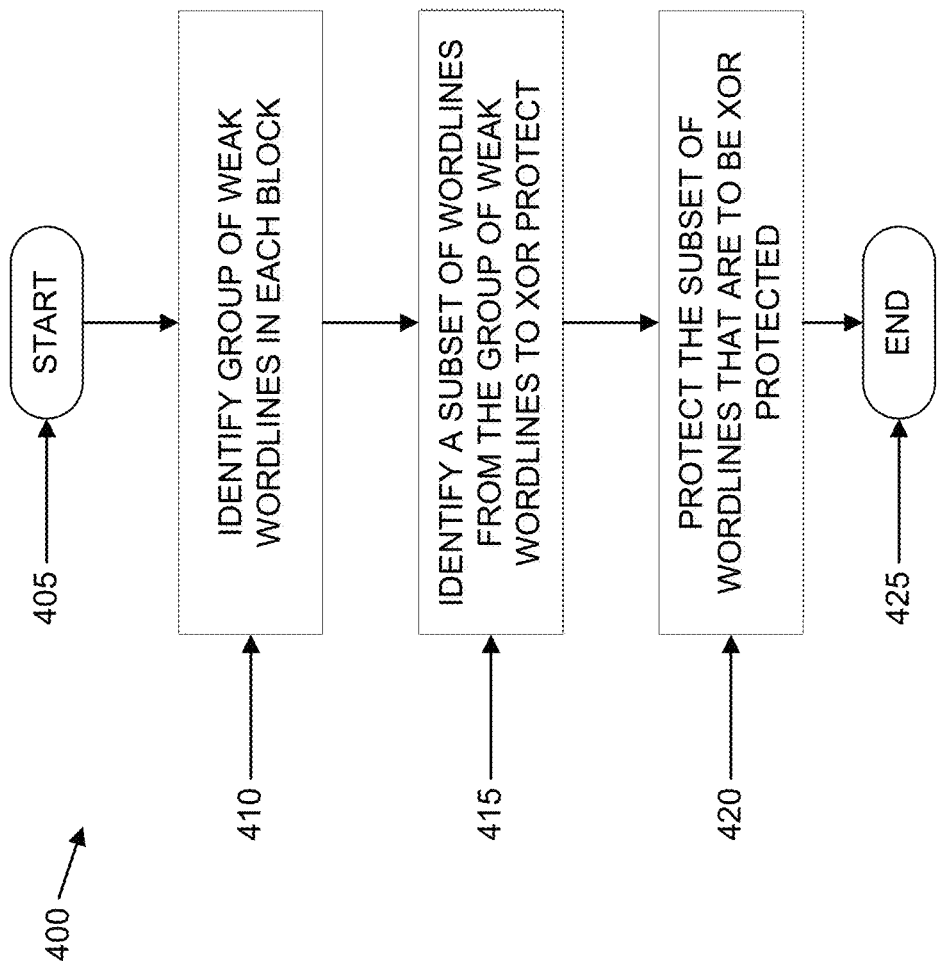
FIG. 4 is an example flowchart outlining operations for applying the partial XOR protection in the first embodiment of FIG. 3, in accordance with some embodiments of the present disclosure.

Turning to FIG. 4, an example flowchart outlining operations of a process 400 is shown, in accordance with some embodiments of the present disclosure. The process 400 may include additional or other operations based upon the specific embodiment. The process 400 is discussed in conjunction with FIG. 3. In some embodiments, the process 400 may be implemented during development or production (e.g., during fabrication, before packing, after packaging but before shipping to the consumer, etc.) of the memory module 300. In other embodiments, the process 400 may be implemented after development and during operation of the memory module 300. The process 400 may be part of a memory health testing of the memory module 300.

The memory health testing may be performed by sending instructions to the memory controller (e.g., the memory controller 130) associated with the memory module 300 based upon instructions received from the host device (e.g., the host device 105). In other embodiments, the memory health testing may be performed by the test circuit (e.g., the test circuit 145) connected to the memory module 300. In some embodiments, memory health testing may be performed by sending a test pattern to the memory module 300. The test pattern may include a test operation (e.g., read, write, erase) that is to be performed by the memory module 300 within a designated period of time (e.g., a timeout period). The memory health testing may then analyze the results of the test operation. If the memory module 300 fails to complete the test operation within the timeout period, the memory health testing may determine that the portion of the memory module that failed to complete the test operation has gone bad. If the memory module 300 completes the test operation within the timeout period but with an error rate that exceeds a threshold, the memory health testing may categorize the portion of the memory module with the high error rate as a "weak" area. In some embodiments, the memory health testing may include current leak detection, cell voltage distribution anomaly, failed bit count, wordline to wordline shorts, etc. In other embodiments, other or additional memory health tests may be performed.

Thus, the process 400 may be used to identify the "weak" areas of each of the plurality of blocks 305A-305I. Therefore, upon starting at operation 405, a group of wordlines that are considered "weak" are identified from each of the plurality of blocks 305A-305I at operation 410. A "weak" wordline is identified based upon the memory health testing discussed above. Memory health testing may identify "weak" wordlines as those that fail to meet certain predetermined criterion or behave differently from other wordlines. For example, in some embodiments, value of a parameter (e.g., failed bit count, bit error rate, etc.) associated with the wordlines of one or more of the plurality of blocks 305A-305I may be measured from each of the wordlines of those blocks. From the measured values, an average may be computed. Then the value of the parameter for each wordline of a particular one of the plurality of blocks 305A-305I may be compared with the computed average parameter. If the value of the parameter deviates from the computed average parameter by more than a predetermined threshold, that wordline may be designated as "weak." In some embodiments, the computed average parameter may be computed for each block of the plurality of blocks 305A-305I separately. Thus, the criterion for identifying "weak" wordlines may vary from one block to another. In some embodiments, the computed average parameter may be computed for a subset or all of the plurality of blocks 305A-305I together. In such cases, the same criterion may be applied to multiple blocks for identifying the "weak" wordlines. In other embodiments, other mechanisms for identifying "weak" wordlines may be used. Further, in some embodiments, a single parameter may be used to identify the "weak" wordlines, while in other embodiments, multiple parameters may be used. Thus, based upon memory health testing, a group of "weak" wordlines may be identified from each of the plurality of blocks 305A-305I.

Upon identifying the group of "weak" wordlines, at operation 415, a subset of wordlines from the group of "weak" wordlines are identified for XOR protection. In some embodiments, all wordlines in the group of "weak" wordlines identified at the operation 410 may be designated for XOR protection. In other embodiments, a subset of wordlines may be selected from the group of "weak" wordlines for XOR protection. In some embodiments, the decision of whether to protect all wordlines in the group of "weak" wordlines identified at the operation 410 may be made based upon a threshold. For example, in some embodiments, if the number of wordlines in the group of "weak" wordlines is below the threshold, all wordlines in the group of "weak" wordlines may be XOR protected. On the other hand, if the number of wordlines in the group of "weak" wordlines is equal to or above the threshold, additional criterion may be used to identify a subset of wordlines from the group of "weak" wordlines to be XOR protected.

For example, in some embodiments, wordlines may be selected based upon the location/placement of those wordlines. In some embodiments, the first few wordlines may be selected for XOR protection if those wordlines are classified as "weak" at the operation 410. For example, inventors have found that the first four wordlines (e.g., wordlines 0, 1, 2, 3) are more likely to malfunction, and therefore, more suitable for XOR protection. In other embodiments, other criterion may be used to identify which ones of the "weak" wordlines to XOR protect.

In some embodiments, certain wordlines (e.g., the wordlines 0-3) may be designated for XOR protection regardless of whether those wordlines are classified as "weak" at the operation 410. For example, in some embodiments, the wordlines that may not be "weak" at the time of performing the memory health testing but are expected to become "weak" later in time (e.g., the wordlines 0-3) may be designated to be XOR protected regardless of being classified "weak." Thus, at the operation 415, the wordlines 310A-310I that are to be XOR protected are identified.

At operation 420, the wordlines 310A-310I are XOR protected. In some embodiments, XOR protection may be achieved by programming data stored via the wordlines 310A-310I with an XOR signature. An XOR signature may be obtained by performing an XOR operation on bits of the data and storing the result of the XOR operation as the XOR signature along with the data on the wordlines 310A-310I. In other embodiments the XOR signature may be stored temporarily in a memory of the controller (e.g., controller random access memory or other memory) until integrity of the data is verified post-programming. After data integrity is verified, the XOR signature associated with the data may be discarded. In other embodiments, other or additional mechanisms may be used for XOR protection of the wordlines 310A-310I. Upon XOR protecting the wordlines 310A-310I, the process 400 ends at operation 425.

In some embodiments, the process 400 may be performed once. In other embodiments, the process 400 may be repeated periodically on one or more of the plurality of blocks 305A-305I. When performed periodically, the memory health testing may be performed at predetermined periods of time or upon satisfaction of certain conditions. For example, in some embodiments, each time a wordline is programmed or read from, a memory healthy testing may be performed on the memory module 300. In other embodiments, after a designated number of wordlines from the memory module 300 have been programmed or read from, the memory health testing may be performed. In other embodiments, the memory health testing may be performed on-demand on one or more of the plurality of blocks 305A-305I. By protecting only certain wordlines of each block of the memory module 300, the overall performance of the memory module may increase. The latency of recovering data may also decrease, and the overall complexity and cost of the memory module may decrease.

Figure 5:
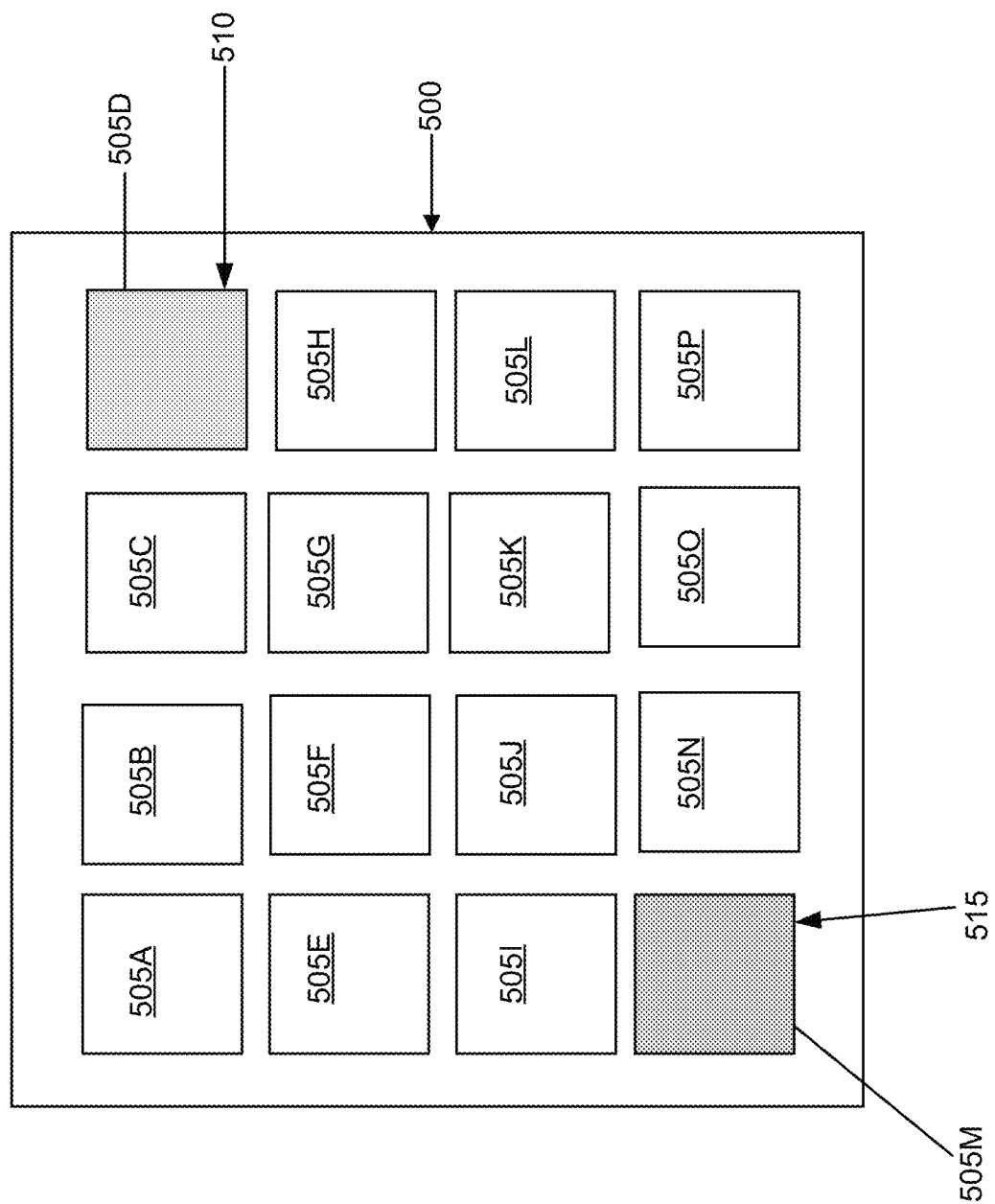
FIG. 5 is an example block diagram of a second embodiment for applying the partial XOR protection, in accordance with some embodiments of the present disclosure.

Referring now to FIG. 5, a simplified example block diagram of a memory module 500 is shown, in accordance with some embodiments of the present disclosure. The memory module 500 is similar to the memory module 200 in that the memory module 500 may include similar elements as the memory module 200. For example, although not shown, the memory module 500 may include a plurality of NAND strings, with each of the plurality of NAND strings having a plurality of memory cells, a first select transistor connected to a source line, a second select transistor connected to a bit line, and wordlines connected to the control terminal of each of the plurality of memory cells.

The memory module 500 may also include read/write circuits similar to the read/write circuits 265. Further, the plurality of NAND strings of the memory module 500 may be grouped into one or more blocks (e.g., similar to the block 260). For example, the memory module 500 may include a plurality of blocks 505A-505P. It is to be understood that the number of the plurality of blocks 505A-505P may vary from one embodiment to another. Further, although not shown, each of the plurality of blocks 505A-505P includes a plurality of wordlines.

In contrast to FIGS. 3 and 4 in which a subset of wordlines from each of the plurality of blocks 305A-305I is selected for XOR protection, in the memory module 500 only certain ones of the plurality of blocks 505A-505P are selected for XOR protection. For example, and as shown in FIG. 5, instead of identifying "weak" wordlines from each of the plurality of blocks 505A-505P, a block 510 and a block 515 may be selected for XOR protection. Although two blocks (e.g., the block 510, the block 515) have been shown as being XOR protected in FIG. 5, in other embodiments, a single block or more than two blocks may be selected for XOR protection. All of the wordlines of the selected blocks (e.g., the block 510, the block 515) may be XOR protected, as discussed in FIG. 7 below.

Figure 6:
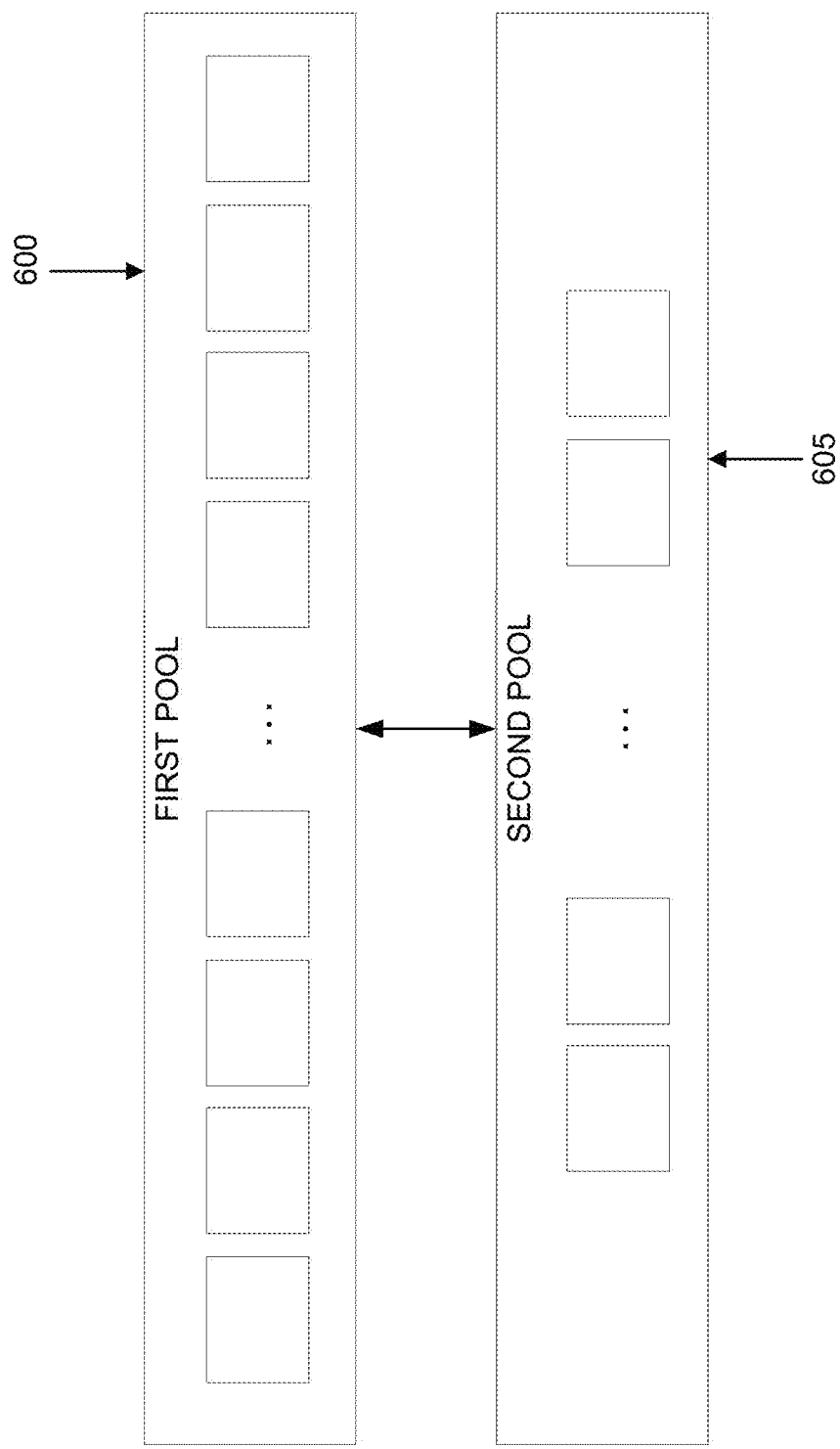
FIG. 6 is an example block diagram showing additional details of the second embodiment of FIG. 5, in accordance with some embodiments of the present disclosure.

Referring to FIG. 6 in conjunction with FIG. 5, each of the plurality of blocks 505A-505P may be sorted between a first pool 600 and a second pool 605. The first pool 600 may be considered a high-quality pool while the second pool 605 may be considered a protected pool. Thus, in some embodiments, the second pool 605 may include blocks from the plurality of blocks 505A-505P that are selected for XOR protection. For example, the block 510 and the block 515 of the plurality of blocks 505A-505P may be placed within the second pool 605. All remaining blocks (e.g., the unselected blocks) may be placed into the first pool 600. By placing each of the plurality of blocks 505A-505P in either the first pool 600 or the second pool 605, the blocks that are to be XOR protected may be easily identified. The blocks that are in the first pool 600 may not need XOR protection, at least at the time when those blocks are placed in the first pool 600 and are thus classified as "high quality" blocks. In some embodiments, a weaker or simpler protection than the XOR protection, or another protection method, may be applied to the blocks in the first pool 600.

Additionally, or alternatively, in some embodiments, a weaker or simpler protection than the XOR protection may be applied to the blocks in the second pool 605. Specifically, in some embodiments, if the number of blocks in the second pool 605 is less than a predetermined threshold, a simpler or weaker XOR protection or another protection may be applied to those blocks, thereby eliminating XOR protection entirely. When the number of blocks in the second pool 605 exceeds the predetermined threshold, some or all of those blocks in the second pool may be protected via XOR protection.

Further, in some embodiments, the contents of the first pool 600 and the second pool 605 may change. For example, one or more of the plurality of blocks 505A-505P may be transferred from the first pool 600 to the second pool 605 when memory health testing is performed on the memory module 500 and blocks that were originally in the first pool are selected for XOR protection. Such blocks may be transferred to the second pool 605 and all of the wordlines of those blocks may be XOR protected (or protected using other means). The first pool 600 and the second pool 605 may be data structures (e.g., tables, logs, etc.) that identify the plurality of blocks 505A-505P that are categorized in those pools. For example, in some embodiments, a first table may be used for the first pool 600 and a second table may be used for the second pool 605. In such cases, identities of the plurality of blocks 505A-505P that are to be categorized under the first pool 600 may be listed in the first table and identities of the plurality of blocks that are to be categorized in the second pool 605 may be listed in the second table. When any block of the plurality of blocks 505A-505P is moved from the first pool 600 to the second pool 605, the first table may be updated to delete that block and the second table may be updated to add that block. Thus, the first pool 600 and the second pool 605 may dynamically change. In other embodiments, the first pool 600 and the second pool 605 may be configured in other ways.

Figure 7:
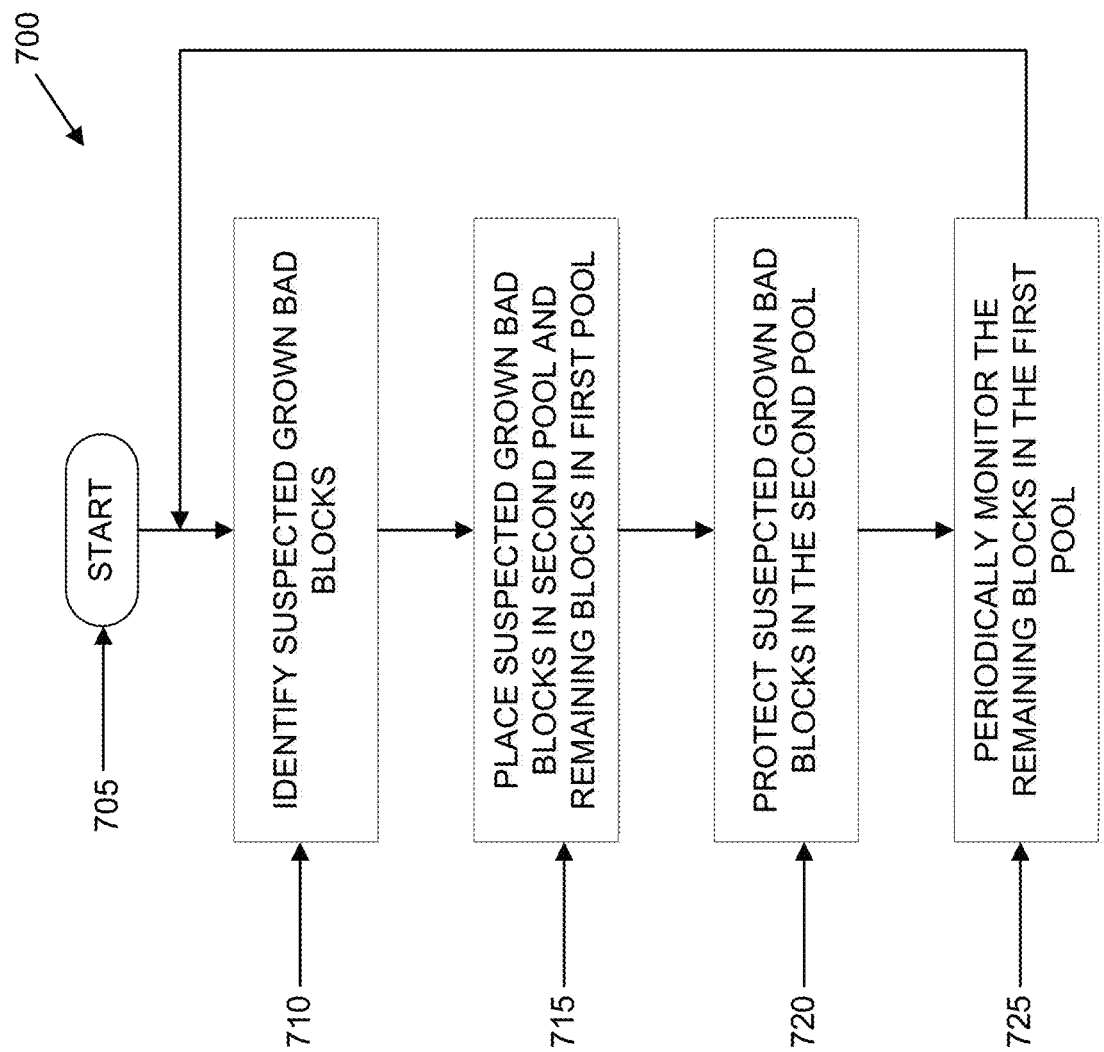
FIG. 7 is an example flowchart outlining operations for applying the partial XOR protection in the second embodiment of FIG. 5, in accordance with some embodiments of the present disclosure.

Turning to FIG. 7, an example flowchart outlining a process 700 is shown, in accordance with some embodiments of the present disclosure. The process 700 may include additional or other operations based upon the specific embodiment. The process 700 is discussed in conjunction with FIGS. 5 and 6. In some embodiments, the process 700 may be implemented during development or production (e.g., during fabrication, before packing, after packaging, etc.) of the memory module 500 when memory health testing is performed on the memory module. In other embodiments, the process 700 may be implemented after development and during operation of the memory module 500 when the memory health testing is performed. Thus, the memory health testing to implement the process 700 may be performed one or multiple times during the lifetime of the memory module 500. In some embodiments, the memory health testing may be performed automatically at designated time periods or upon satisfaction of certain conditions. For example, in some embodiments, the memory health testing may be performed after a particular block has been programmed. In other embodiments, the memory health testing may be performed every few hours, days, years, or in any other units of time, as desired.

Further, in some embodiments, the memory health testing may be performed by sending instructions to the memory controller (e.g., the memory controller 130) associated with the memory module 500 based upon instructions received from the host device (e.g., the host device 105) and/or instructions received from another component (e.g., the test circuit 145) connected to the memory module. Further, when the memory health testing is performed on the memory module 500, in some embodiments, the memory health testing may be performed on all of the plurality of blocks 505A-505P, while in other embodiments, the memory health testing may be performed on a single block or a subset of those blocks. For example, when memory health testing is performed when a block of the plurality of blocks 505A-505P is programmed, in some embodiments, programming a single block may initiate the memory health testing on all of the blocks regardless of whether those blocks initiated the memory health testing or not. In other embodiments, programming a single block may initiate the memory health testing on only that block and possibly a subset of other blocks that may be selected based on a predetermined criterion for memory health testing.

Thus, the process 700 starts at operation 705 when memory health testing is to be performed on the memory module 500, on either a single, a subset, or all of the plurality of blocks 505A-505P. At operation 710, suspected grown bad blocks are identified from the blocks undergoing testing. For purposes of explanation below, it is assumed that all of the plurality of blocks 505A-505P are being memory health tested. However, the process 700 may be similarly used for memory health testing on a single or a subset of the plurality of blocks 505A-505P. In some embodiments, the memory health testing is performed on those ones of the plurality of blocks 505A-505P that are in the first pool 600, or in other words, are still considered "high quality blocks" before the operation 710. When the process 700 is performed for the first time, all of the plurality of blocks 505A-505P may be classified under the first pool 600. Therefore, the operation 710 may be performed on all of the plurality of blocks 505A-505P. As some blocks from the plurality of blocks 505A-505P are transferred to the second pool 605 for protection, the operation 710 may be performed on fewer blocks. Further, as the blocks of the plurality of blocks 505A-505P are transferred from the first pool 600 to the second pool 605, the number of blocks in the first pool decreases and the number of blocks in the second pool increases. In some embodiments, the memory health testing may also be performed on the blocks of the plurality of blocks 505A-505P that are in the second pool 605 to determine if any of the blocks in the second pool have gone bad, and therefore, do not need XOR protection anymore (because they will not be used after going bad).

Thus, at the operation 710, suspected grown bad blocks from the plurality of blocks 505A-505P are identified from the first pool 600. "Suspected grown bad blocks" are those blocks that either have gone bad at the time of performing the operation 710 or have not necessarily gone bad at the time of performing the operation 710, but are expected to grow bad within a predetermined period of time of performing the operation 710. The suspected grown bad blocks may be identified in any of a variety of ways. In some embodiments, a similar mechanism as that used for identifying the "weak" wordlines may be used. For example, in some embodiments, a predetermined parameter may be measured from all or a subset of the plurality of blocks 505A-505P and an average may be computed. If the measured parameter of a particular block deviates from the computed average by more than a predetermined threshold, that particular block may be considered a suspected grown bad block. In some embodiments, the number of wordlines that have gone bad or "weak" may be used as an indicator of suspected grown bad blocks. For example, in some embodiments, if the number of wordlines that have gone bad or "weak" in a particular block exceeds a predetermined threshold, that particular block may be considered a suspected grown bad block.

In some embodiments, testing may be done to identify the "high" quality blocks. It may be easier to identify "high" quality blocks than blocks that have either gone bad (also referred to herein as actual grown bad blocks) or are suspected to go bad (e.g., suspected grown bad blocks). Thus, memory testing may be performed to identify the "high" quality blocks, which may be placed in the first pool 600. All remaining blocks, which include the suspected grown bad blocks, may be placed in the second pool 605. Other mechanisms may be used to identify the suspected grown bad blocks.

In some embodiments, the suspected grown bad blocks that have actually gone bad at the time of performing the operation 710 may be marked as "bad blocks" and may not be used during operation of the memory module 500. In some embodiments, the "bad blocks" may be transferred to the second pool 605 or to a third pool that includes only "bad blocks." Once the "bad blocks" are transferred out of the first pool 600, the first pool may be updated to delete the "bad blocks" from the first pool. The suspected grown bad blocks that are not "bad blocks" are transferred from the first pool 600 to the second pool 605 at operation 715. The first pool 600 and the second pool 605 may be updated to reflect the transfer of the suspected grown bad blocks from the first pool to the second pool. At operation 720, the suspected grown bad blocks that were transferred to the second pool 605 at the operation 715 are XOR protected.

In some embodiments, all of the wordlines of the suspected grown bad blocks are XOR protected, as discussed above. In some embodiments, mechanisms such as wear levelling may be applied to the suspected grown bad blocks such that those blocks are used less, and therefore, experience less stress making them less likely to convert to "bad blocks." In some embodiments, if the number of the suspected grown bad blocks in the second pool 605 is below a predetermined threshold, a simpler XOR protection or other protection mechanism may be applied to those blocks, thereby completely avoiding the need for XOR protection. Any other type of protection that may be considered desirable to apply to the suspected grown bad blocks in the second pool 605 may be applied. Further, in some embodiments, XOR protection is not applied to the blocks that remain in the first pool 600. In some embodiments, a lighter protection method may be applied to the blocks that remain in the first pool 600.

At operation 725, the plurality of blocks 505A-505P in the first pool 600 are monitored, as discussed above. In some embodiments, the monitoring may be periodic based on certain criterion, while in other embodiments, the monitoring may be continuous such that as soon as any change is detected in a block of the plurality of blocks 505A-505P, the process 700 may be repeated for the block that changed or for all of the blocks when any block is changed. Further, when the number of the suspected grown bad blocks in the second pool 605 exceeds a threshold, in some embodiments, some or all of those blocks (including those blocks that may not have been XOR protected or protected using other mechanisms in the second pool) may be XOR protected. By virtue of monitoring the plurality of blocks 505A-505P in the first pool 600 for suspected grown bad blocks, and protecting only the suspected grown bad blocks in the second pool 605, only a fraction of the blocks need to be XOR protected, thereby increasing performance of the memory module 500.

Figure 8:
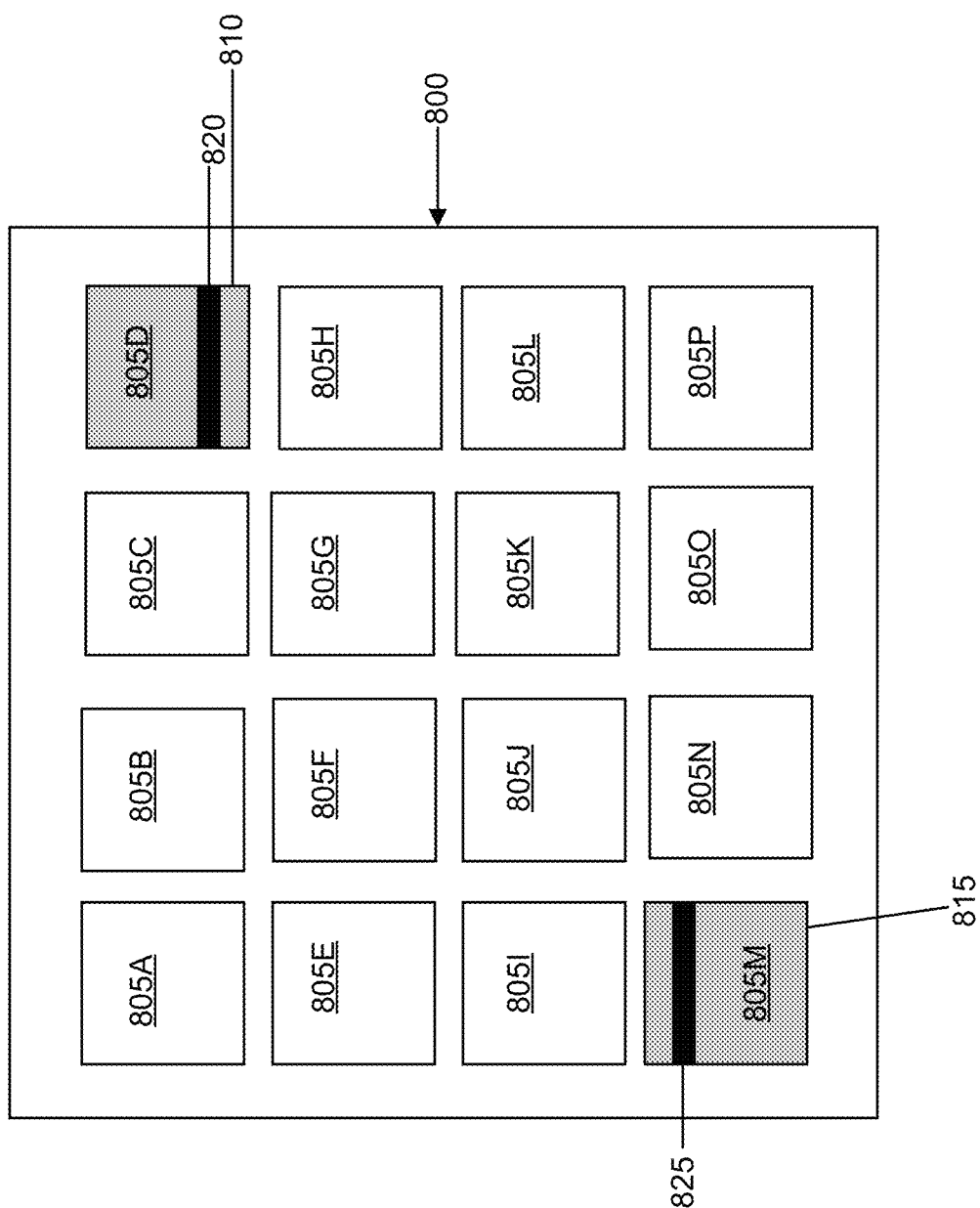
FIG. 8 is an example block diagram of a third embodiment for applying the partial XOR protection, in accordance with some embodiments of the present disclosure.

Turning now to FIG. 8, a simplified example block diagram of a memory module 800 is shown, in accordance with some embodiments of the present disclosure. The memory module 800 is similar to the memory module 200 in that the memory module 800 may include similar elements as the memory module 200. For example, although not shown, the memory module 800 may include a plurality of NAND strings, with each of the plurality of NAND strings having a plurality of memory cells, a first select transistor connected to a source line, a second select transistor connected to a bit line, and word lines connected to the control terminal of each of the plurality of memory cells. The memory module 800 may also include read/write circuits similar to the read/write circuits 265. Further, the plurality of NAND strings of the memory module 800 may be grouped into one or more blocks (e.g., similar to the block 260). For example, the memory module 800 may include a plurality of blocks 805A-805P. It is to be understood that the number of blocks within the plurality of blocks 805A-805P may vary from one embodiment to another. Further, although not shown, each of the plurality of blocks 805A-805P includes a plurality of wordlines.

The memory module 800 is a combination of the embodiments of the memory module 300 and the memory module 500. Specifically, and similar to the memory module 500, in the memory module 800, a few blocks from the plurality of blocks 805A-805P may be selected for XOR protection. For example, and as shown in FIG. 8, block 810 and 815 may be selected for XOR protection. Although only two blocks (e.g., the block 810 and the block 815) are shown selected for XOR protection in the memory module 800, in other embodiments, a single block or more than two blocks may be selected for XOR protection. Further, although the block 810 and the block 815 are shown as being located at opposite ends of the memory module 800, it is to be understood that the relative locations of the blocks that are selected for XOR protection does not matter. Any block that is identified as a suspected grown bad block may be selected for XOR protection. Thus, the block 805 and the block 810 are suspected grown bad blocks that have been identified in the same way as discussed above with respect to FIGS. 5-7.

However, in contrast to the memory module 500 in which all the wordlines of the selected blocks (e.g., the block 510, the block 515) are XOR protected (or protected using other mechanisms), in the memory module 800, only a subset of wordlines of the selected blocks (e.g., the block 810, the block 815) are selected for XOR protection similar to that in the memory module 300. For example, one or more wordlines 820 may be identified as "weak" for XOR protection in the block 810. Similarly, one or more wordlines 825 may be identified as "weak" for XOR protection in the block 815. Thus, instead of XOR protecting all of the wordlines in a few selected blocks (as in the memory module 500) or XOR protecting a few wordlines in all of the blocks (as in the memory module 300), the memory module 800 provides a compromise in which a few wordlines (e.g., the wordlines 825, the wordlines 835) of a few selected blocks (e.g., the block 810, the block 815) are XOR protected.

Figure 9:
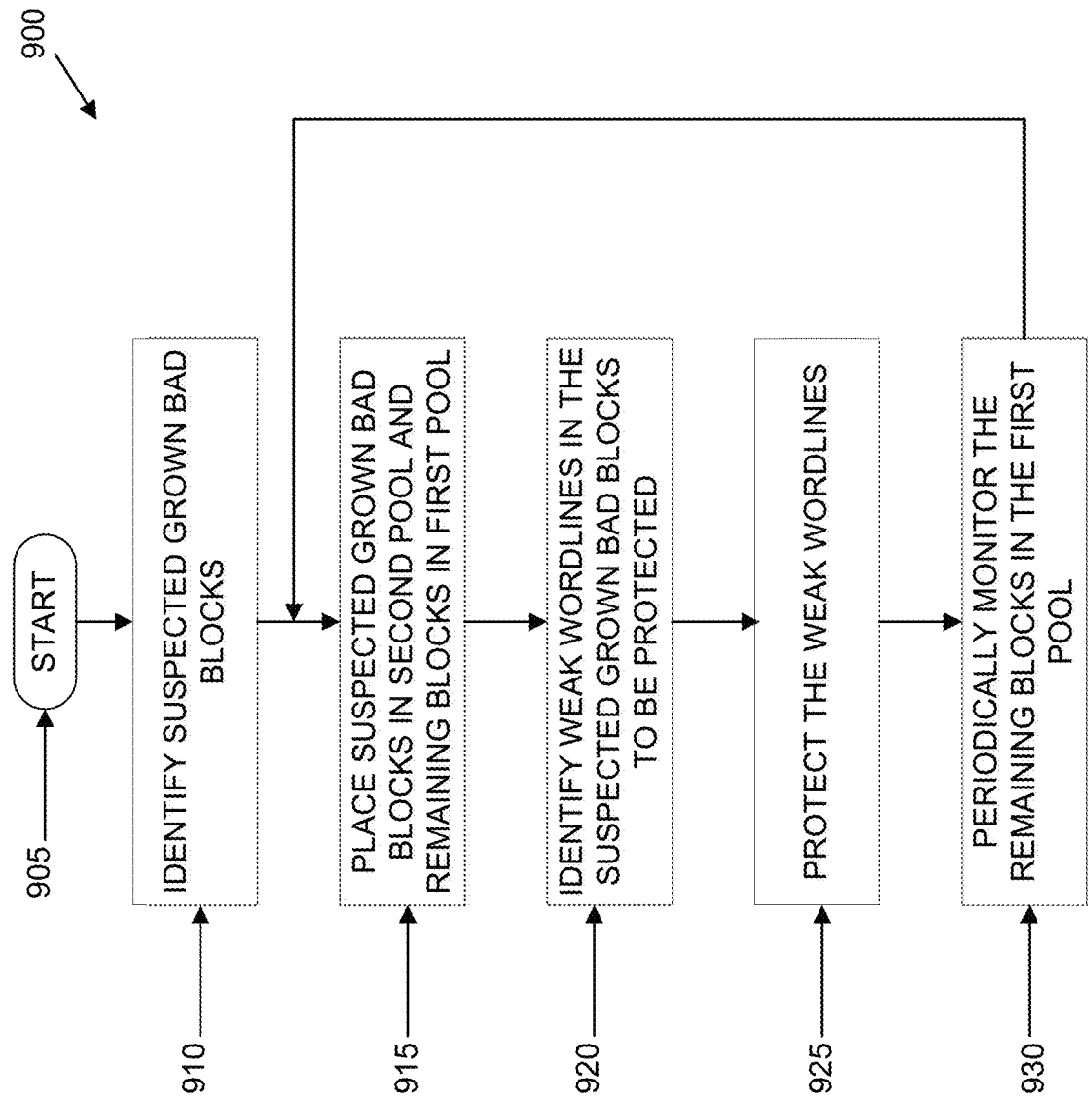
FIG. 9 is an example flowchart outlining operations for applying the partial XOR protection in the third embodiment of FIG. 8, in accordance with some embodiments of the present disclosure.

Referring now to FIG. 9, an example flowchart outlining operations of a process 900 is shown, in accordance with some embodiments of the present disclosure. The process 900 may include additional or other operations based upon the specific embodiment. The process 900 is discussed in conjunction with FIG. 8. In some embodiments, the process 900 may be implemented during development or production (e.g., during fabrication, before packing, after packaging, etc.) of the memory module 800 when memory health testing is performed on the memory module. In other embodiments, the process 900 may be implemented after development and during operation of the memory module 800 when the memory health testing is performed. Thus, the memory health testing to implement the process 900 may be performed one or multiple times during the lifetime of the memory module 800. In some embodiments, the memory health testing may be performed automatically at pre-determined designated time periods or upon satisfaction of certain conditions. For example, in some embodiments, the memory health testing may be performed after a particular block has been programmed. In other embodiments, the memory health testing may be performed every few hours, days, years, or in any other units of time, as desired.

Further, in some embodiments, the memory health testing may be performed by sending instructions to the memory controller (e.g., the memory controller 130) associated with the memory module 800 based upon instructions received from the host device (e.g., the host device 105) and/or instructions received from another component (e.g., the test circuit 145) connected to the memory module. Further, when the memory health testing is performed on the memory module 800, in some embodiments, the memory health testing may be performed on all of the plurality of blocks 805A-805P, while in other embodiments, the memory health testing may be performed on a single block or a subset of those blocks, as discussed above.

Thus, the process 900 starts at operation 905 when memory health testing is desired to be performed. At operation 910, the suspected grown bad blocks in the memory module 800 are identified similar to the operation 710. The identified suspected grown bad blocks (e.g., the block 810, the block 815) are placed in a second pool (e.g., similar to the second pool 605), while the blocks that are not categorized as suspected grown bad blocks are placed in a first pool (e.g., similar to the first pool 600) at operation 915. At operation 920, the "weak" wordlines or the wordlines that are to be XOR protected in the blocks selected at the operation 910 are identified similar to the operations 410 and 415. The identified wordlines are XOR protected at operation 925. The operation 925 is similar to the operation 420. At operation 930, the blocks that remain the first pool are monitored similar to the operation 725 and the process 900 is repeated when the monitoring criterion is satisfied.

Therefore, by providing a partial XOR protection mechanism in which only "weak" areas of a block and/or only certain blocks of a memory module are XOR protected, the present disclosure achieves XOR protection in an effective and cost efficient manner, while increasing the performance of the associated memory module.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances, where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A memory device comprising:
 a plurality of blocks of memory cells, wherein each of the plurality of blocks comprises a plurality of wordlines; and
 a memory controller in communication with the plurality of blocks of memory cells, the memory controller configured to:
 categorize the plurality of blocks of memory cells into a first pool of the blocks and a second pool of the blocks, wherein the second pool comprises suspected grown bad blocks of the plurality of blocks and the first pool comprises remaining blocks of the plurality of blocks that are not the suspected grown bad blocks;

apply a first level of protection to each of the plurality of wordlines of each of the suspected grown bad blocks in the second pool;

periodically monitor the remaining blocks of the memory module in the first pool for identifying an additional suspected grown bad block;

transfer the additional suspected grown bad block to the second pool; and apply the first level of protection to each of the plurality of wordlines of the additional suspected grown bad block.

2. The memory device of claim 1, wherein the memory controller is further configured to identify that a first block of the plurality of blocks is one of the suspected grown bad blocks or the additional suspected grown bad block based upon a parameter associated with the first block deviating from a predetermined threshold by a predetermined value.

3. The memory device of claim 1, wherein the memory controller is further configured to combine a wear leveling mechanism with the first level of protection.

4. The memory device of claim 1, wherein the memory controller is further configured to apply another protection to the remaining blocks of the memory module in the first pool.

5. The memory device of claim 4, wherein:
the first level of protection includes XOR protection; and
the other level of protection does not include XOR protection.

6. A memory device comprising:
one or more memory modules, each of the one or more memory modules comprising a plurality of blocks, and each of the plurality of blocks comprising a plurality of wordlines; and
a memory controller associated with each of the one or more memory modules,
wherein the memory controller is configured to:
identify a group of wordlines in the one or more memory modules for XOR protection;
apply the XOR protection to the group of wordlines; and
periodically monitor a plurality of wordlines in the one or more memory modules for which the XOR protection is not applied to update the group of wordlines for which the XOR protection is applied.

7. The memory device of claim 6, wherein the memory controller is further configured to apply a second protection to each of the plurality of wordlines to which the memory controller does not apply the XOR protection.

8. The memory device of claim 6, wherein the memory controller is further configured to apply a wear leveling mechanism to the group of wordlines in addition to the XOR protection.

9. The memory device of claim 6, wherein the group of wordlines to which the XOR protection is applied comprise first four wordlines of each of the plurality of blocks.

10. An apparatus, comprising:
a memory controller configured to connect to a plurality of blocks of non-volatile memory cells, wherein the memory controller is configured to:
apply a first level of protection to reduce risk of losing data to a set of one or more word lines in a first block of the plurality of blocks; and
apply a second level of protection to reduce risk of losing data to a plurality of wordlines in the first block that do not receive the first level of protection.

11. The apparatus of claim 10, wherein the first level of protection includes XOR protection.

12. The apparatus of claim 11, wherein the second level of protection does not include XOR protection.

13. The apparatus of claim 12, wherein:
the second level of protection includes error correction code protection.

14. The apparatus of claim 10, wherein:
the first level of protection includes XOR protection over a first stripe height; and
the second level of protection includes XOR protection over a second stripe height that is larger than the first stripe height.

15. The apparatus of claim 10, wherein the memory controller is further configured to:
include the first wordline in the set in response to identification of the first wordline as a weak wordline.

16. The apparatus of claim 15, wherein the memory controller is further configured to:
measure a value of a parameter from each of the plurality of wordlines in the first block;
compute an average value of the measured value from each of the plurality of wordlines in the first block; and
identify the first wordline as a weak wordline in response to the value of the parameter for the first wordline deviating from the average value of the parameter by a predetermined threshold.

17. The apparatus of claim 10, wherein the memory controller is further configured to:
select at least one suspected grown bad block from the plurality of blocks;
identify a weak wordline from each of the at least one suspected grown bad block; and
place the at least one suspected grown bad block in a first pool and placing remaining ones of the plurality of blocks in a second pool.

18. The apparatus of claim 17, wherein the memory controller is further configured to:
periodically monitor the remaining ones of the plurality of blocks in the second pool for identify an additional suspected grown bad block.

19. The apparatus of claim 18, wherein the memory controller is further configured to:
transfer the additional suspected grown bad block to the first pool.

20. The apparatus of claim 10, wherein the memory controller is further configured to:
designate a subset of the plurality of wordlines from each of the plurality of blocks as a weak wordline on which the first level of protection is applied.

* * * * *